United States Patent
Iwahori

(10) Patent No.: US 11,538,656 B2
(45) Date of Patent: Dec. 27, 2022

(54) SAMPLE HOLDER AND CHARGED PARTICLE BEAM DEVICE

(71) Applicant: HITACHI HIGH-TECH SCIENCE CORPORATION, Tokyo (JP)

(72) Inventor: Toshiyuki Iwahori, Tokyo (JP)

(73) Assignee: HITACHI HIGH TECH SCIENCE CORPORATION, Tokyo (JP)

( * ) Notice: Subject to any disclaimer, the term of this patent is extended or adjusted under 35 U.S.C. 154(b) by 318 days.

(21) Appl. No.: 17/028,461

(22) Filed: Sep. 22, 2020

(65) Prior Publication Data
US 2021/0090848 A1 Mar. 25, 2021

(30) Foreign Application Priority Data
Sep. 25, 2019 (JP) .............................. JP2019-173703

(51) Int. Cl.
*H01J 37/20* (2006.01)
(52) U.S. Cl.
CPC .......... *H01J 37/20* (2013.01); *H01J 2237/002* (2013.01); *H01J 2237/2007* (2013.01); *H01J 2237/20214* (2013.01)
(58) Field of Classification Search
CPC ...... H01J 37/20; H01J 37/26; H01J 2237/002; H01J 2237/204; H01J 2237/2001; H01J 2237/2005; H01J 2237/2002; H01J 2237/2007; H01J 2237/20214
See application file for complete search history.

(56) References Cited

U.S. PATENT DOCUMENTS

| 8,198,603 B2 * | 6/2012 | Takahashi ........... H01J 37/3056 250/442.11 |
| 2014/0151555 A1 * | 6/2014 | Ogashiwa ............... H01J 37/20 250/310 |

FOREIGN PATENT DOCUMENTS

JP 2005-136389 A 5/2005

* cited by examiner

*Primary Examiner* — David E Smith
*Assistant Examiner* — Hsien C Tsai
(74) *Attorney, Agent, or Firm* — Holland & Hart LLP

(57) ABSTRACT

A sample holder (19) includes a base portion (41), a sample carrying portion (42), a rotation guide portion (43), a cooling stage (46), a connection member (47), a first support portion, and a fixing guide portion (48). The base portion (41) is configured to be fixed to a stage (12), which is configured to be driven to rotate by a stage driving mechanism (13). The rotation guide portion (43) is configured to guide synchronous rotation of the base portion (41) and the sample carrying portion (42). The cooling stage (46) is configured to cool a sample (S). The connection member (47) is configured to be connected to the cooling stage (46). The first support portion is configured to support the base portion (41), which is configured to be driven to rotate by the stage (12).

14 Claims, 9 Drawing Sheets

SAMPLE HOLDER AND CHARGED PARTICLE BEAM DEVICE

CROSS REFERENCE TO RELATED APPLICATION(S)

This application claims the benefit of Japanese Patent Application No. 2019-173703, filed Sep. 25, 2019, which is hereby incorporated by reference in their entirety into this application.

BACKGROUND OF THE INVENTION

1. Field of the Invention

The present invention relates to a sample holder and a charged particle beam device.

2. Description of the Related Art

Hitherto, there has been a demand for charged particle beam devices such as electron beam devices, focused ion-beam devices, or complex beam devices using a focused ion beam and an electron beam to perform so-called in-situ sample analyses of various types. For example, there have been known charged particle beam devices including, for example, a cooling stage for processing and observing a sample while cooling the sample, a multi-probe for analyzing electrical characteristics of a sample, and a nano-intender for analyzing mechanical characteristics of a sample.

For example, there has been known a focused ion-beam device including, as components for cooling a sample, a sample holder, which is configured to hold a sample inside a sample chamber, and a heat-transmitting member for cooling, which is coupled to the sample holder and is led to the outside through a cooling port provided to the sample chamber (see, for example, Japanese Patent Application Laid-open No. 2005-136389).

In the charged particle beam device described above, in some cases, for example, tubes and cables of various types are arranged on a plurality of dedicated ports which are formed in the sample chamber so as to be adaptable to a plurality of different sample analyses. However, when the plurality of dedicated ports are formed in the sample chamber, there is a fear in that layout of various devices is limited. Moreover, for example, when a stage (sample stage) configured to be driven by a rotary mechanism having a plurality of different rotation axes is provided, there is a fear in that the connection of the tubes and cables required for sample analyses of various types to the stage or the sample holder causes difficulty in performing desired drive.

SUMMARY OF THE INVENTION

The present invention has been made in view of the above-mentioned circumstances.

According to at least one embodiment of the present invention, there is provided a sample holder, including: a base portion configured to be fixed to a driving stage; a sample carrying portion configured to carry a sample; a drive guide portion configured to guide synchronous drive of the base portion and the sample carrying portion; a function portion configured to perform a predetermined function with respect to the sample; a connection member configured to be connected to the function portion; a first support portion configured to support the base portion, which is configured to be driven by the driving stage, and the connection member in such a manner that the base portion and the connection member are movable relative to each other; and a fixing guide portion, which is connected to the base portion through intermediation of the first support portion, and is configured to guide fixing of the connection member independently of the base portion.

According to the configuration described above, the sample holder may further include a second support portion configured to support the sample carrying portion, which is configured to be driven by the driving stage, and the function portion in such a manner that the sample carrying portion and the function portion are movable relative to each other, wherein the function portion may be connected to the sample carrying portion through intermediation of the second support portion.

According to the configuration described above, the function portion may be configured to cool the sample carrying portion with use of a refrigerant which flows through a flow passage formed inside and the connection member.

According to the configuration described above, the drive guide portion may have a heat-insulating structure.

According to the configuration described above, the sample holder may further include a conduction/connection portion configured to connect the function portion, which is fixed to the sample carrying portion configured to be driven by the driving stage, and the connection member in such a manner that the function portion and the connection member are movable relative to each other in a state of conduction.

According to at least one embodiment of the present invention, there is provided a charged particle beam device, including: any of the above-mentioned sample holders; a sample chamber on which the driving stage is arranged; a charged-particle beam lens column configured to irradiate the sample with a charged particle beam; a replacement chamber mounted to the sample chamber; an opening/closing portion configured to open and close a boundary between the sample chamber and the replacement chamber; and a conveyance member configured to convey the sample holder between the sample chamber and the replacement chamber.

According to the at least one embodiment of the present invention, with the fixing guide portion configured to guide the fixing of the connection member, which is configured to be connected to the function portion, independently of the base portion configured to be driven by the driving stage, a position and a posture of a sample can easily be changed while suppressing the complexity of a device configuration.

DESCRIPTION OF THE EMBODIMENTS

Referring to the accompanying drawings, a sample holder and a charged particle beam device according to an embodiment of the present invention is described below.

(Charged Particle Beam Device)

Figure 1:
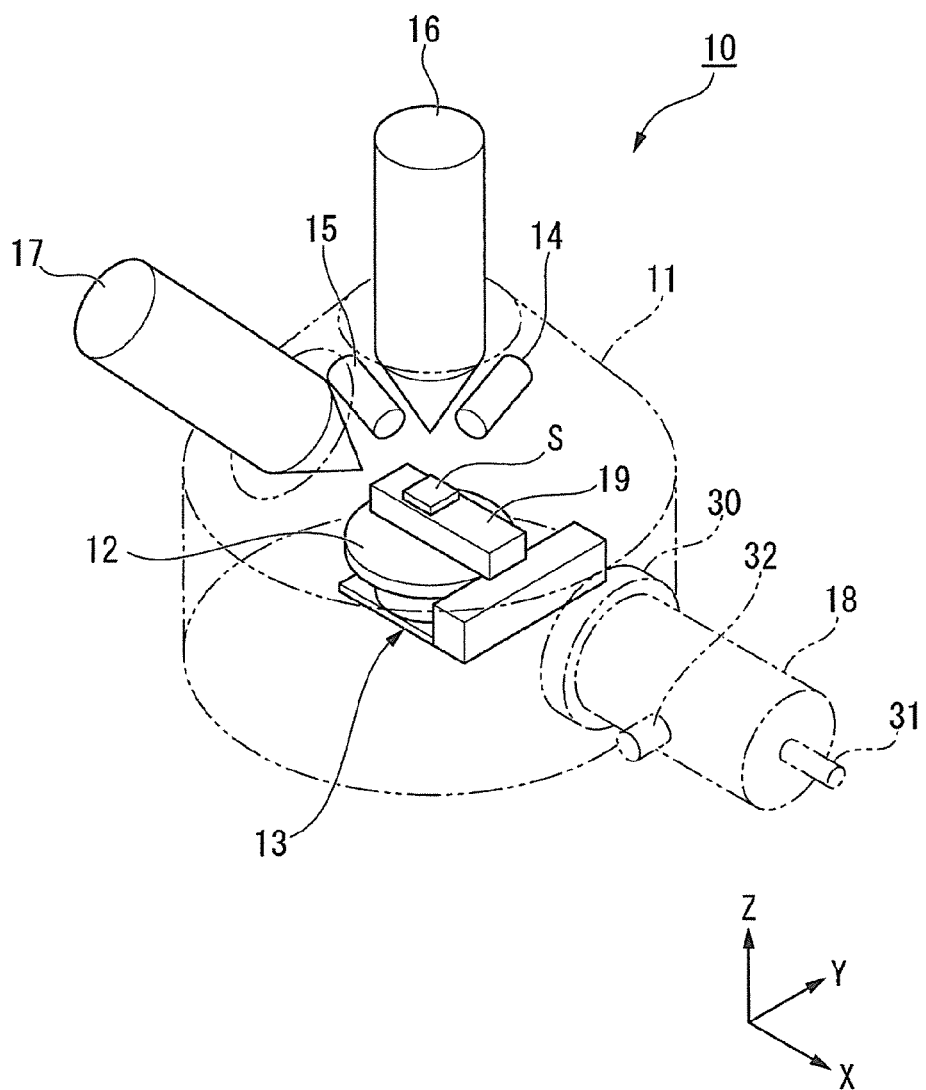
FIG. 1 is a perspective view for illustrating a configuration of a charged particle beam device according to an embodiment of the present invention.
Figure 2:
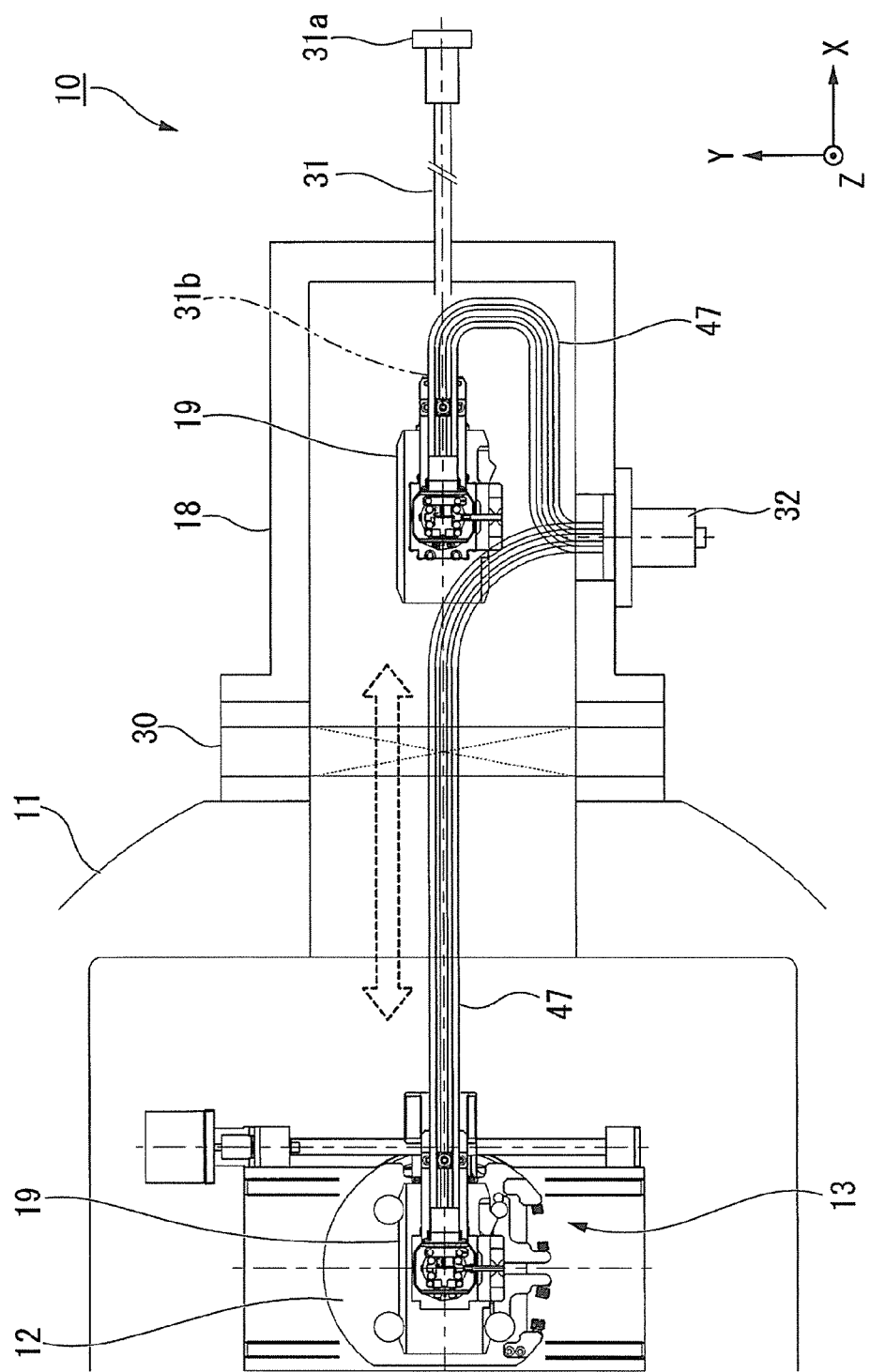
FIG. 2 is a partial cutaway view for illustrating a sample chamber and a replacement chamber of the charged particle beam device according to the embodiment of the present invention, as seen from the Z-axis direction.

FIG. 1 is a perspective view for illustrating a configuration of a charged particle beam device 10 according to an embodiment of the present invention. FIG. 2 is a partial cutaway view for illustrating a sample chamber 11 and a replacement chamber 18 of the charged particle beam device 10 according to the embodiment, as seen from the Z-axis direction. In the following, the X-axis, the Y-axis, and the Z-axis form a three-dimensional orthogonal coordinate system. Axial directions of the X-axis, Y-axis, and the Z-axis orthogonal to one another in a three-dimensional space are directions parallel to the corresponding axes. The X-axis direction and the Y-axis direction are parallel to a reference plane orthogonal to an up-and-down direction of the charged particle beam device 10 (for example, a horizontal plane). The Z-axis direction is parallel to the up-and-down direction of the charged particle beam device 10 (for example, a vertical direction orthogonal to the horizontal plane).

The charged particle beam device 10 is, for example, a complex beam device using an electron beam and a focused ion beam. The charged particle beam device 10 includes the sample chamber 11, a stage (sample stage) 12, a stage driving mechanism 13, a detector 14, a gas supplying portion 15, an electron-beam lens column 16, a focused-ion-beam lens column 17, the replacement chamber 18, and a sample holder 19.

The inside of the sample chamber 11 is maintained under reduced pressure.

The stage 12 is arranged on the stage driving mechanism 13 inside the sample chamber 11. The stage 12 is configured to fix the sample holder 19. The stage driving mechanism 13 is fixed inside the sample chamber 11. The stage driving mechanism 13 is configured to drive the stage 12 in accordance with an instruction from a control device (not shown).

Figure 3:
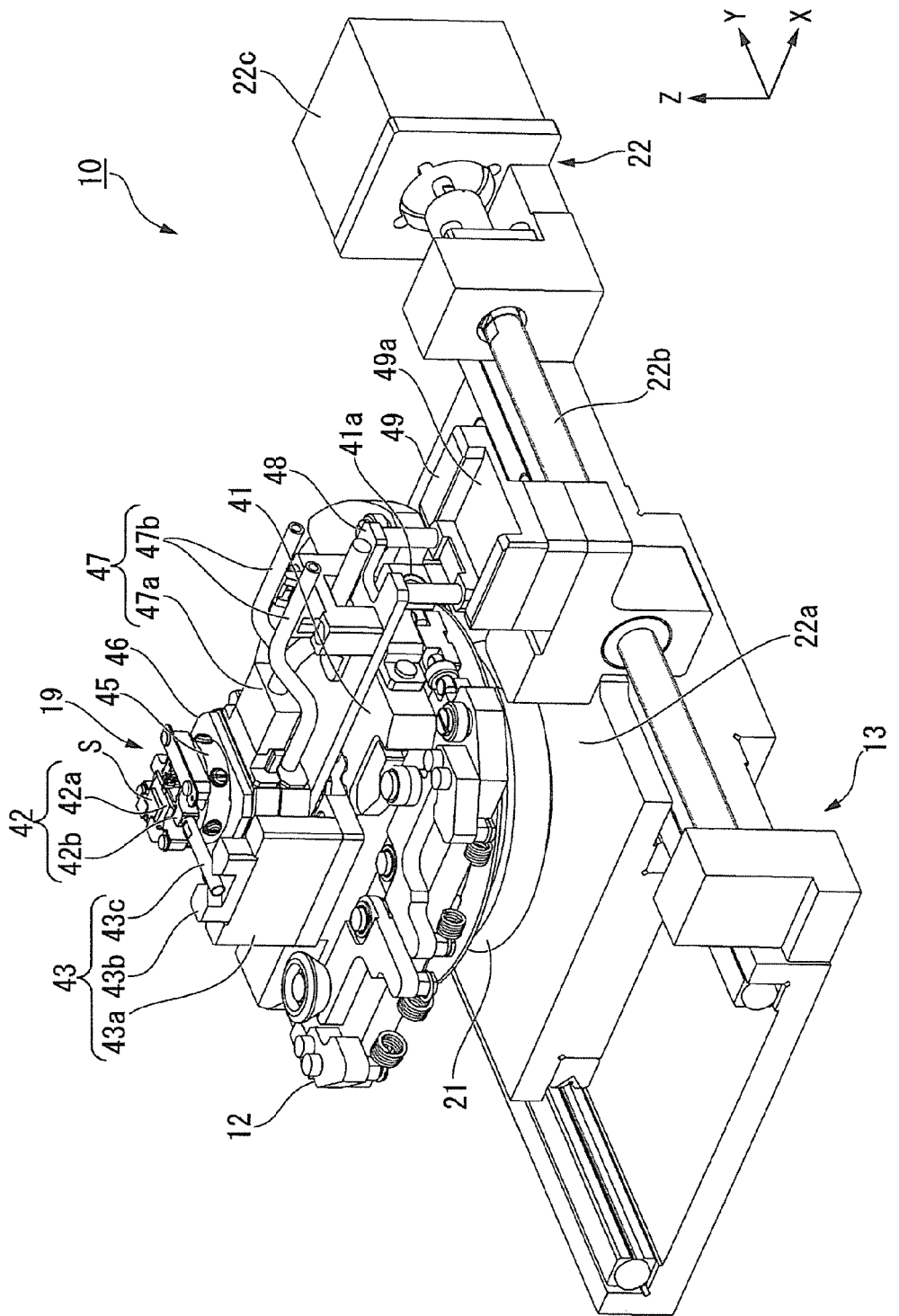
FIG. 3 is a perspective view for illustrating respective configurations of a stage and a sample holder of the charged particle beam device according to the embodiment of the present invention.

FIG. 3 is a perspective view for illustrating respective configurations of the stage 12 and the sample holder 19 of the charged particle beam device 10 according to the embodiment. The stage driving mechanism 13 includes, for example, a rotary mechanism 21 and a linear-motion mechanism 22. The rotary mechanism 21 is configured to rotate the stage 12 about a predetermined rotation axis. An axis direction of the predetermined rotation axis of the rotary mechanism 21 is, for example, parallel to the Z-axis direction. The linear-motion mechanism 22 is configured to slide the stage 12 and the rotary mechanism 21 in a predetermined direction. The predetermined direction of the slide movement caused by the linear-motion mechanism 22 is, for example, parallel to the Y-axis direction. The linear-motion mechanism 22 includes, for example, a slide table 22a, a linear-motion shaft portion 22b, and a driving portion 22c. The slide table 22a has the rotary mechanism 21 arranged thereon. The linear-motion shaft portion 22b extends in the predetermined direction. The driving portion 22c is configured to move the slide table 22a along the linear-motion shaft portion 22b.

As illustrated in FIG. 1, the detector 14 is fixed to the sample chamber 11. The detector 14 is, for example, a secondary-charged-particle detector configured to detect secondary charged particles (secondary electrons and secondary ions) which are generated from a sample S through irradiation of the sample S with a focused ion beam.

The gas supplying portion 15 is fixed to the sample chamber 11. The gas supplying portion 15 is configured to supply, for example, etching gas and deposition gas to the sample S. The etching gas selectively promotes etching on the sample S with the focused ion beam in accordance with a material of the sample S. The deposition gas forms a deposition film formed of a deposit made of, for example, a metal or an insulator on a surface of the sample S.

The electron-beam lens column 16 is fixed to the sample chamber 11. The electron-beam lens column 16 includes an electron source and an electron optical system. The electron source is configured to generate an electron beam. The electron optical system is configured to focus and deflect the electron beam generated by the electron source.

The focused-ion-beam lens column 17 is fixed to the sample chamber 11. The focused-ion-beam lens column 17 includes an ion source and an ion optical system. The ion source is configured to generate an ion beam. The ion optical system is configured to focus, deflect, and correct the ion beam generated by the ion source.

As illustrated in FIG. 1 and FIG. 2, the replacement chamber 18 is mounted to the sample chamber 11 through intermediation of a partition valve 30. The partition valve 30 is configured to switch opening and closing of a through hole (not shown) configured to allow respective inner spaces of the sample chamber 11 and the replacement chamber 18 to communicate with each other. The inside of the replacement chamber 18 is maintained under reduced pressure when the replacement chamber 18 communicates with the sample chamber 11.

The replacement chamber 18 includes a conveyance member 31 and a feedthrough 32.

The conveyance member 31 has, for example, a rod-like outer shape. A center axis of the conveyance member 31 is, for example, parallel to the X-axis direction. A first end portion 31a of the conveyance member 31 in the axial direction projects to the outside of the replacement chamber 18. A second end portion 31b of the conveyance member 31 in the axial direction is coupled to the sample holder 19. The conveyance member 31 advances and retreats in the axial direction to convey the sample holder 19 between the replacement chamber 18 and the sample chamber 11.

The feedthrough 32 is connected to a connection member 47, which is described later, of the sample holder 19. The feedthrough 32 is configured to transport, for example, an electric signal or a fluid between the inside and the outside of the replacement chamber 18. With the feedthrough 32 provided to the replacement chamber 18, as compared to the case in which a dedicated port is provided to the sample chamber 11, the degree of freedom in layout of various devices increases, thereby suppressing the complexity of a device configuration.

(Sample Holder)

Figure 4:
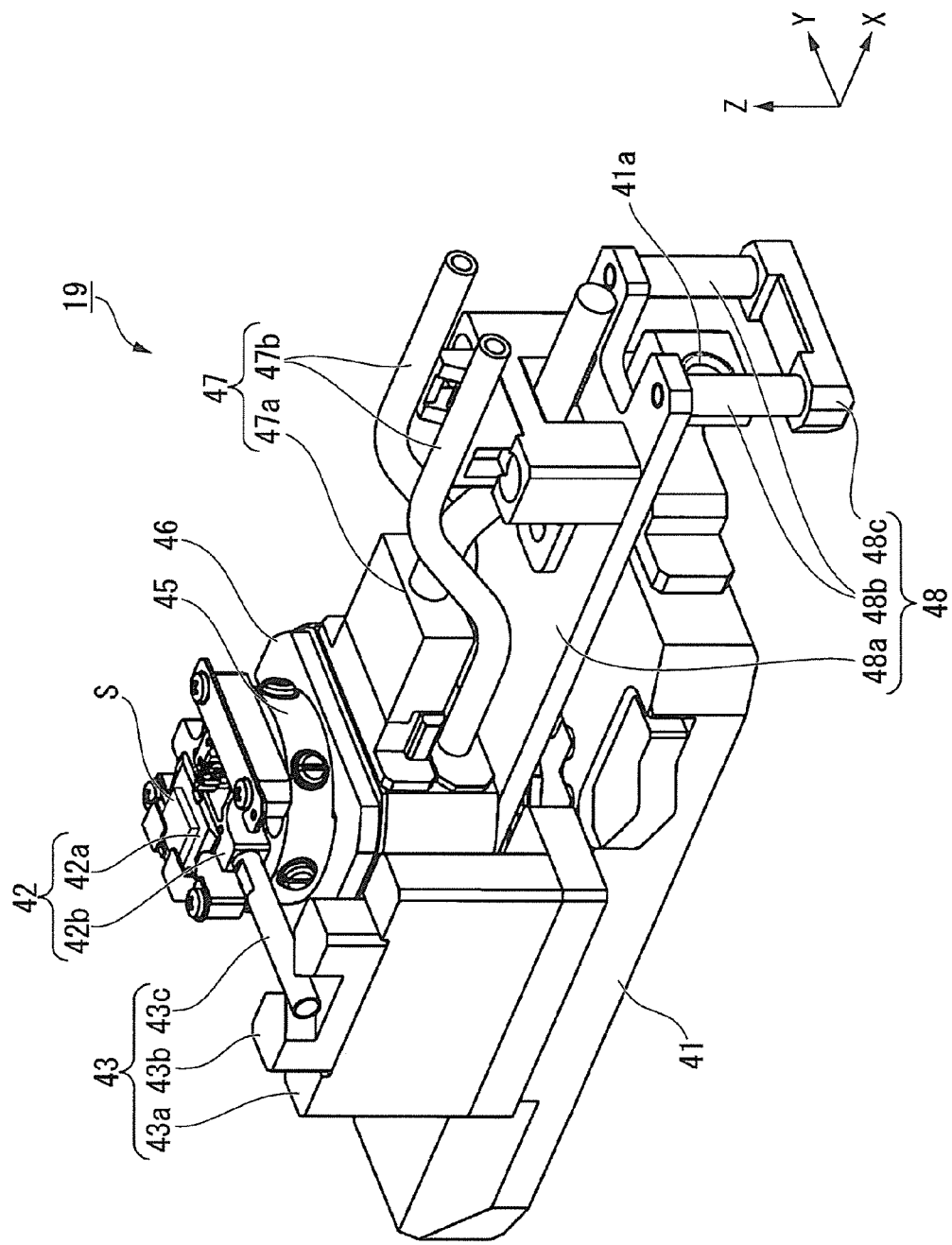
FIG. 4 is a perspective view for illustrating a configuration of the sample holder according to the embodiment of the present invention.
Figure 5:
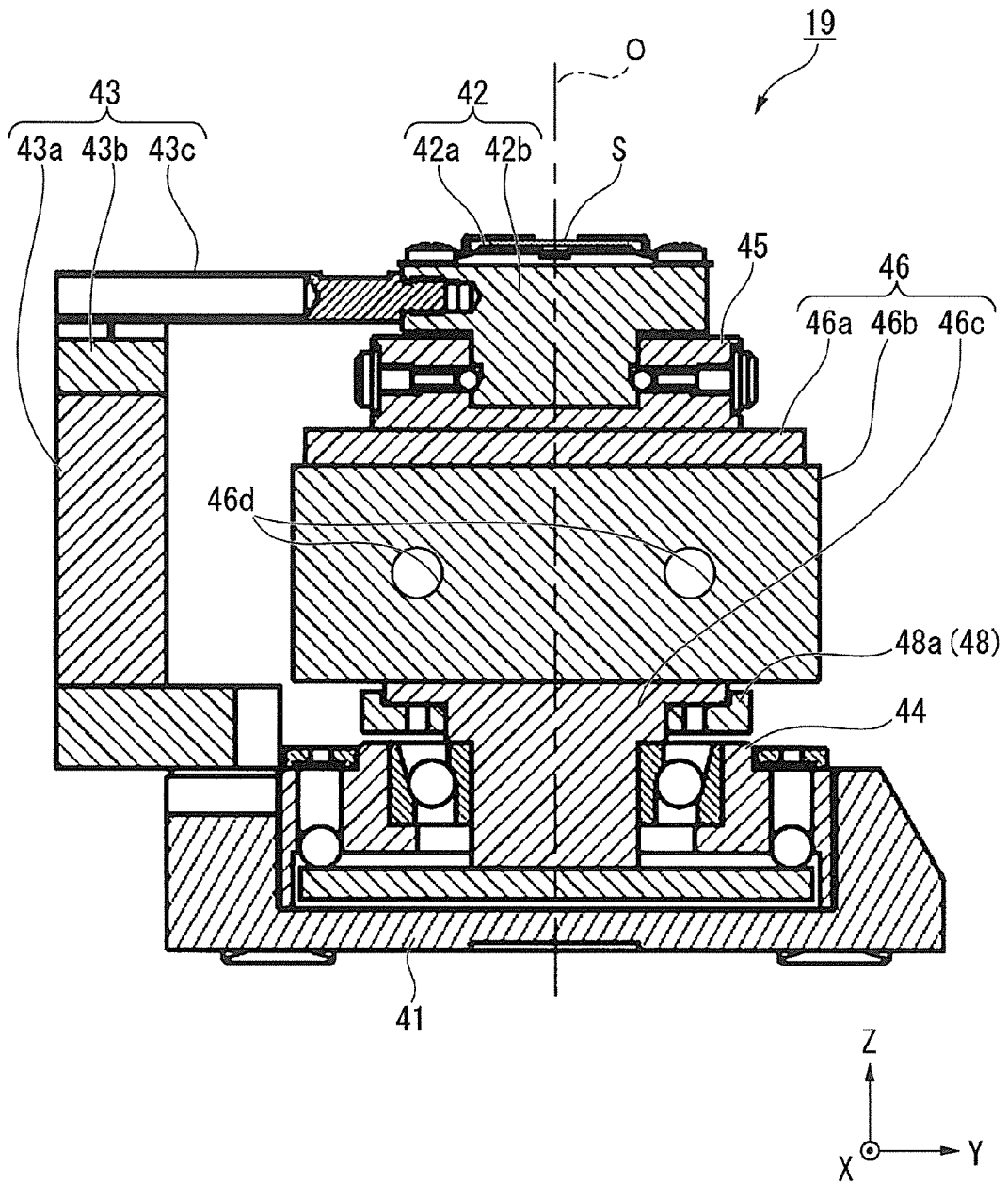
FIG. 5 is a sectional view for illustrating a configuration of the sample holder according to the embodiment of the present invention.

FIG. 4 is a perspective view for illustrating a configuration of the sample holder 19 according to the embodiment. FIG. 5 is a sectional view for illustrating a configuration of the sample holder 19 according to the embodiment.

As illustrated in FIG. 3 to FIG. 5, the sample holder 19 includes a base portion 41, a sample carrying portion 42, a rotation guide portion 43, a first support portion 44, a second support portion 45, a cooling stage 46, the connection member 47, and a fixing guide portion 48.

The base portion 41 is fixed to the stage 12. The base portion 41 is connected to the cooling stage 46 through intermediation of the first support portion 44. For example, at a part of a peripheral edge portion of the base portion 41 on the replacement chamber 18 side along the X-axis direction, there is provided an attachment portion 41a to which the second end portion 31b of the conveyance member 31 in the replacement chamber 18 is attached.

The sample carrying portion 42 is configured to carry the sample S. The sample carrying portion 42 is coupled to the base portion 41 through intermediation of the rotation guide portion 43. The sample carrying portion 42 is thermally connected to the cooling stage 46 through intermediation of the second support portion 45. The sample carrying portion 42 includes, for example, a sample fixing portion 42a and a coupling portion 42b fixed to the sample fixing portion 42a.

The sample fixing portion 42a is configured to fix the sample S. The coupling portion 42b is coupled and fixed to the rotation guide portion 43. The coupling portion 42b is supported by the second support portion 45. The coupling portion 42b supported by the second support portion 45 is rotated about a rotation axis O together with the sample fixing portion 42a by a rotational driving force input from the rotation guide portion 43. The rotation axis O is, for example, the same as a center axis of the sample carrying portion 42. The axis direction of the rotation axis O is, for example, parallel to the Z-axis direction.

The rotation guide portion 43 is coupled and fixed to the base portion 41 and the sample carrying portion 42. The rotation guide portion 43 is configured to guide synchronous rotation of the base portion 41 and the sample carrying portion 42. For example, when the stage 12 is driven to rotate about the rotation axis O by the rotary mechanism 21 of the stage driving mechanism 13, the rotation guide portion 43 rotates the base portion 41 and the sample carrying portion 42 integrally with the stage 12. The rotation guide portion 43 includes, for example, a base coupling portion 43a, a heat-insulating portion 43b, and a heat-insulation coupling portion 43c.

Figure 9:
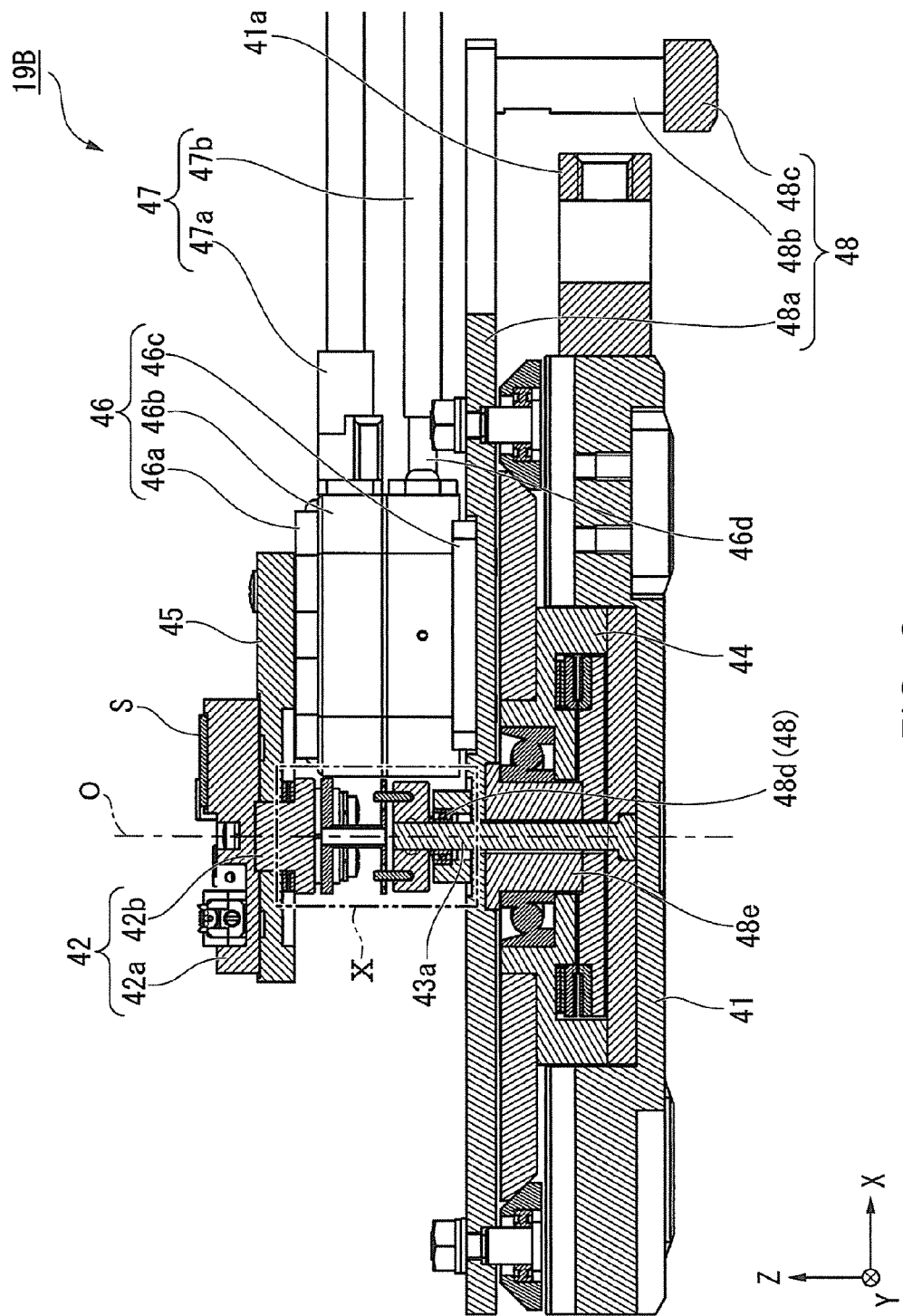
FIG. 9 is a sectional view for illustrating a configuration of a sample holder in a second modification example of the embodiment of the present invention.
Figure 10:
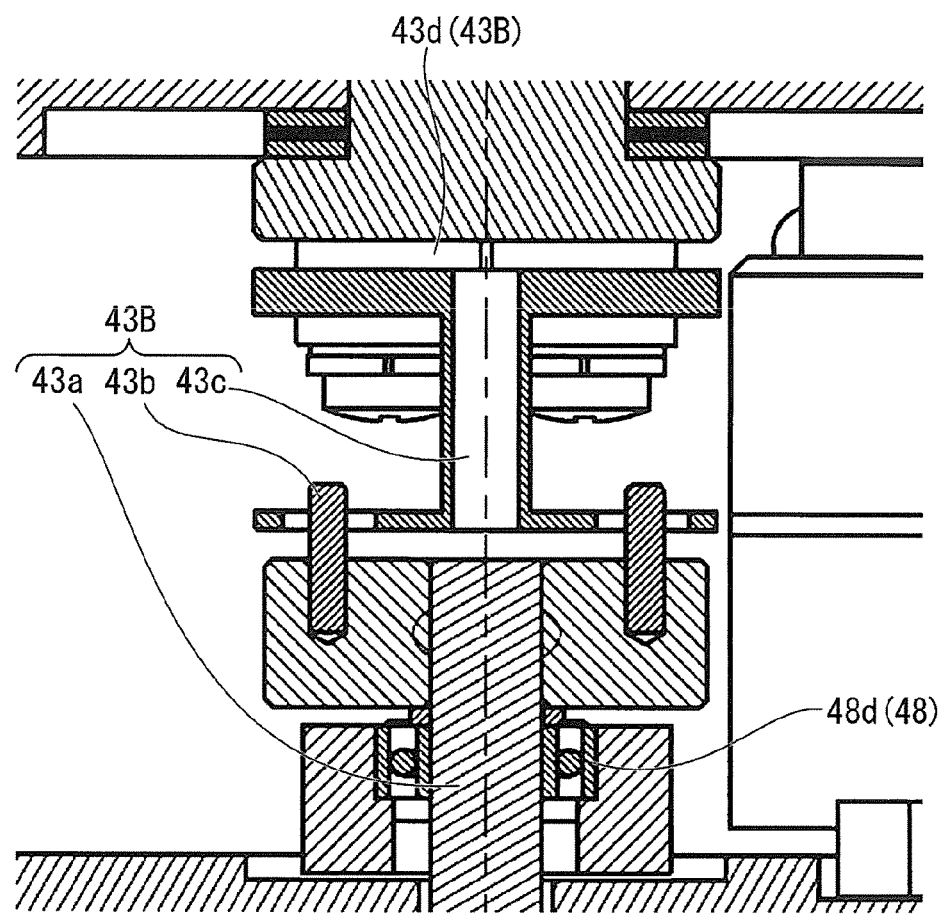
FIG. 10 is a partial enlarged view for illustrating the region X illustrated in FIG. 9.

The base coupling portion 43a has, for example, a plate-like outer shape which is parallel to an X-Z plane, or a rod-like outer shape which is illustrated in FIG. 9 and FIG. 10 and described later. A first end portion of both ends of the base coupling portion 43a in the Z-axis direction is fixed to the base portion 41. The base coupling portion 43a is, for example, arranged apart from the rotation axis O in an X-Y plane.

The heat-insulating portion 43b is provided at a second end portion of the both ends of the base coupling portion 43a in the Z-axis direction. The heat-insulating portion 43b is made of, for example, an adiabatic material having low heat conductivity such as a resin. The heat-insulating portion 43b supports the heat-insulation coupling portion 43c.

The heat-insulation coupling portion 43c is, for example, an adiabatic member having the structure with low heat conductivity such as a thin pipe. The heat-insulation coupling portion 43c is fixed to the coupling portion 42b of the sample carrying portion 42 through, for example, fastening.

The first support portion 44 is, for example, a bearing. The first support portion 44 is arranged on the cooling stage 46. The first support portion 44 is configured to support the base portion 41 configured to rotate relative to the cooling stage 46 about the rotation axis O.

The second support portion 45 is, for example, a bearing. The second support portion 45 is arranged on the cooling stage 46. The second support portion 45 is configured to support the sample carrying portion 42 configured to rotate relative to the cooling stage 46 about the rotation axis O. The second support portion 45 thermally connects the sample carrying portion 42 and the cooling stage 46 through contact or the like so as to cause heat conduction between the sample carrying portion 42 and the cooling stage 46.

The cooling stage 46 includes, for example, a first end portion 46a, a cooling portion 46b, and a second end portion 46c, which are arranged in the stated order along the Z-axis direction and integrated with one another.

The first end portion 46a is connected to the second support portion 45.

The cooling portion 46b is configured to cool the sample S on the sample carrying portion 42 through the first end portion 46a and the second support portion 45. The cooling portion 46b is arranged in such a manner as to intersect the rotation axis O. A center axis of the cooling portion 46b is the same as the rotation axis O. The cooling portion 46b is connected to the connection member 47. The cooling portion 46b includes, for example, a circulation flow passage 46d, a temperature sensor, and a Peltier element. The circulation flow passage 46d is configured to circulate a refrigerant that is to be supplied and discharged through the connection member 47. The temperature sensor is configured to output an electric signal through the connection member 47. The Peltier element is configured to be energized through the connection member 47. The connection member 47 includes, for example, a cable 47a and a pair of tubes 47b. The cable 47a includes a connector for an electric signal and a power supply. The pair of tubes 47b are used for supplying and discharging the refrigerant. The refrigerant is, for example, water or a fluorine-based liquid for cooling the heat-radiation side of the Peltier element, or nitrogen for indirectly cooling the sample S.

The second end portion 46c is connected to the first support portion 44 and is fixed to the fixing guide portion 48.

The fixing guide portion 48 is fixed to the cooling stage 46. The fixing guide portion 48 is connected to the base portion 41 through intermediation of the first support portion 44. The fixing guide portion 48 is configured to guide fixing of the cooling stage 46 and the connection member 47, which is connected to the cooling stage 46, independently of the base portion 41. The fixing guide portion 48 includes, for example, a fixing portion 48a, a pair of coupling portions 48b, and a position regulating portion 48c.

The fixing portion 48a has, for example, a plate-like outer shape extending toward the replacement chamber 18 along the X-axis direction. The fixing portion 48a projects toward the replacement chamber 18 side in the X-axis direction more than the base portion 41. A first end portion of both ends of the fixing portion 48a in the X-axis direction is fixed to the second end portion 46c of the cooling stage 46. A second end portion of the both ends of the fixing portion 48a in the X-axis direction is coupled to the position regulating portion 48c by the pair of coupling portions 48b.

The pair of coupling portions 48b each have, for example, a rod-like outer shape extending in the Z-axis direction. The pair of coupling portions 48b are arranged on both sides of the attachment portion 41a of the base portion 41 in the Y-axis direction as seen from the X-axis direction. The pair of coupling portions 48b are arranged apart from each other by a predetermined distance in the Y-axis direction in such a manner as not to interfere with the conveyance member 31 attached to the attachment portion 41a.

The position regulating portion 48c has, for example, a plate-like outer shape extending in the Y-axis direction. The position regulating portion 48c is fixed to the pair of coupling portions 48b. The position regulating portion 48c is regulated in position by a guide support portion 49 arranged on the linear-motion shaft portion 22b of the linear-motion mechanism 22 of the stage driving mechanism 13 illustrated in FIG. 3. The position regulating portion 48c is, for example, attached to a recessed groove 49a, which is formed in the guide support portion 49 and extends in the X-axis direction, thereby being fixed in position about the rotation axis O inside the sample chamber 11. In particular, even when the stage 12 and the rotary mechanism 21 are slid in the Y-axis direction by the linear-motion mechanism 22, the position regulating portion 48c is maintained in a state of being fixed in position about the rotation axis O.

As described above, with the fixing guide portion 48 configured to guide the fixing of the connection member 47 independently of the base portion 41, the sample holder 19 according to the embodiment is capable of easily changing a position and a posture of the sample S. Even when the base portion 41 and the sample carrying portion 42 rotate synchronously, the fixing guide portion 48 is capable of regulating the connection member 47, which is connected to the cooling stage 46, in position with respect to the sample chamber 11. With this configuration, the position and the posture of the sample S can be suitably set by the stage driving mechanism 13 while suppressing occurrence of a defect such as twisting or winding of the connection member 47, thereby being capable of improving the accuracy in, for example, producing and processing the sample S.

With the second support portion 45 which is configured to support the sample carrying portion 42 driven to rotate synchronously with the base portion 41 and is connected to the cooling stage 46, desired heat conduction between the sample carrying portion 42 and the cooling stage 46 can be ensured while regulating the cooling stage 46 in position with respect to the sample chamber 11.

The rotation guide portion 43 configured to couple the base portion 41 and the sample carrying portion 42 to each other includes the heat-insulating portion 43b and the heat-insulation coupling portion 43c, thereby being capable of preventing suppression of cooling of the sample carrying portion 42 by the cooling stage 46.

Modification Examples

Now, modification examples of the embodiment are described. In the above-mentioned embodiment, the sample holder 19 includes the cooling stage 46. However, the present invention is not limited to such a configuration. A function stage configured to perform a predetermined function with respect to the sample S may be provided in place of the cooling stage 46.

Figure 6:
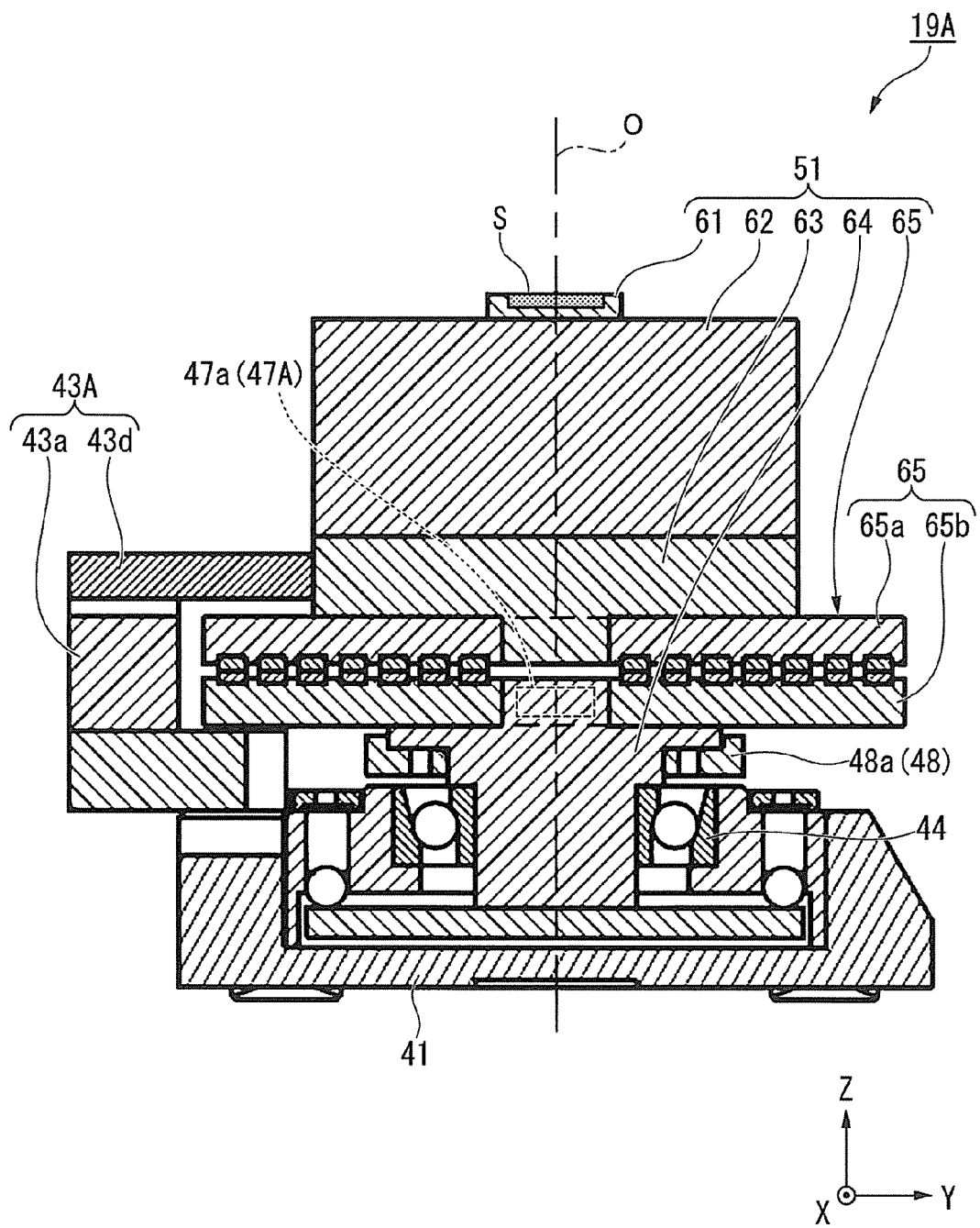
FIG. 6 is a sectional view for illustrating a configuration of a sample holder in a first modification example of the embodiment of the present invention.
Figure 7:
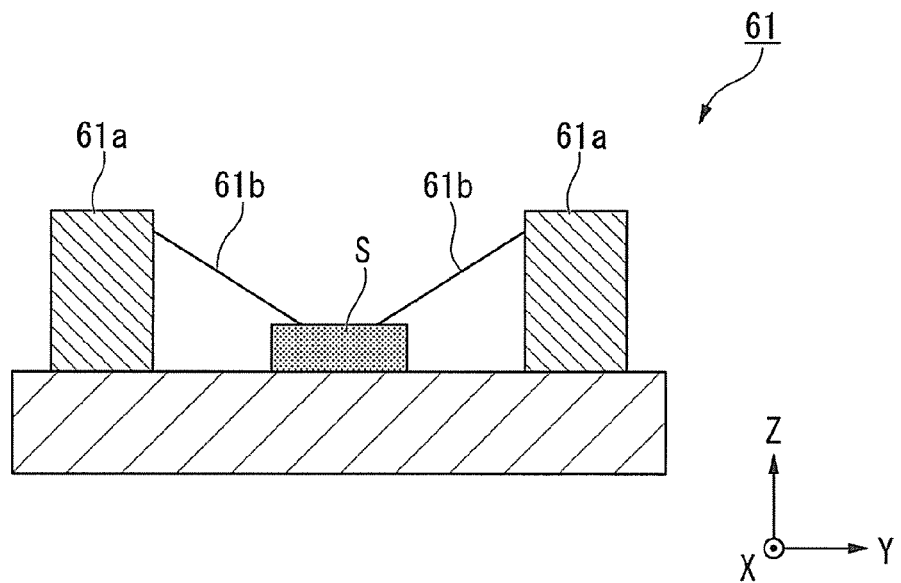
FIG. 7 is a view for illustrating one example of a function stage in the first modification example of the embodiment of the present invention.
Figure 8:
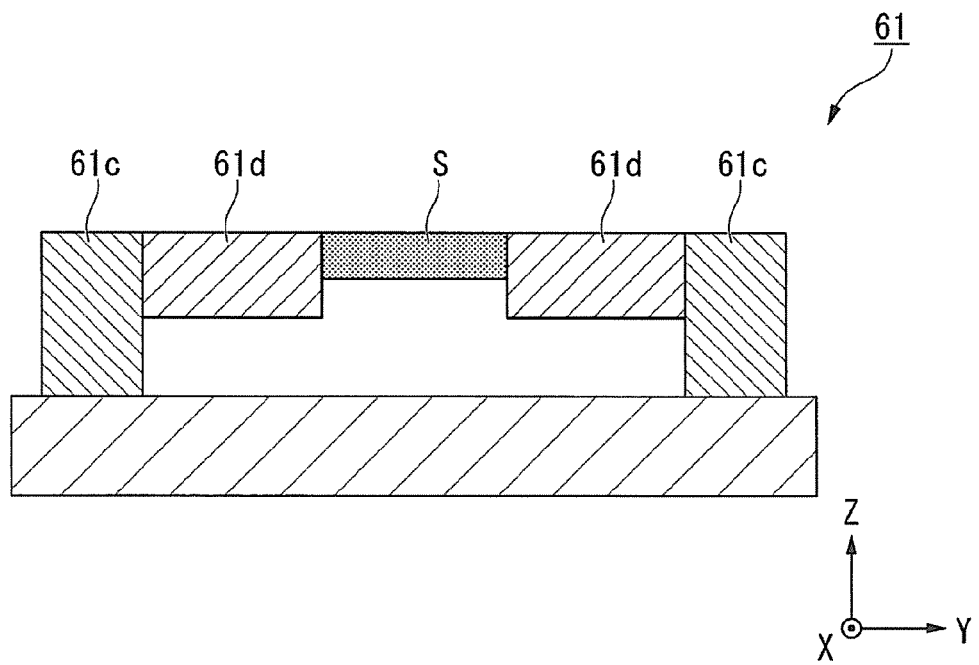
FIG. 8 is a view for illustrating another example of the function stage in the first modification example of the embodiment of the present invention.

FIG. 6 is a sectional view for illustrating a configuration of a sample holder 19A in a first modification example of the embodiment. FIG. 7 is a view for illustrating one example of a function stage 51 in the first modification example of the embodiment. FIG. 8 is a view for illustrating another example of the function stage 51 in the first modification example of the embodiment. In the following, parts which are the same as those of the above-mentioned embodiment are denoted by the same reference symbols, and description thereof is omitted or simplified.

The sample holder 19A of the first modification example includes the base portion 41, the function stage 51, a rotation guide portion 43A, the first support portion 44, a connection member 47A, and the fixing guide portion 48.

The function stage 51 includes, for example, a sample carrying portion 61, a function portion (analysis portion, test portion, or control portion) 62, a coupling portion 63, a connection end portion 64, and a conduction/connection portion 65.

The sample carrying portion 61 is configured to carry and fix the sample S. The sample carrying portion 61 is fixed to the function portion 62. The sample carrying portion 61 has a configuration suitable for a function of the function portion 62.

For example, as illustrated in FIG. 7, in the case of the function portion 62 configured to analyze the electrical characteristics or defective parts of the sample S, the sample carrying portion 61 includes actuators 61a and probes 61b. The actuators 61a are configured to bring the probes 61b into contact with the sample S and perform, for example, application of voltage to the sample S through the probes 61b. The function portion 62 is configured to perform application of, for example, current and voltage through the actuators 61a and the probes 61b and perform measurement.

For example, as illustrated in FIG. 8, in the case of the function portion 62 configured to analyze the mechanical characteristics of the sample S, the sample carrying portion 61 includes actuators 61c and movable mechanism portions 61d. The actuators 61c are configured to drive the movable mechanism portions 61d to perform, for example, extension, compression, twisting, and shearing of the sample S. The function portion 62 is configured to perform supply of power as well as measurement of the quantity of state such as load and displacement through the actuators 61c and the movable mechanism portions 61d.

The coupling portion 63 is fixed to the function portion 62. The coupling portion 63 is coupled to the rotation guide portion 43A.

The rotation guide portion 43A is coupled and fixed to the base portion 41 and the coupling portion 63. The rotation guide portion 43A is configured to guide synchronous rotation of the base portion 41 and the sample carrying portion 61, and the function portion 62. For example, when the stage 12 is driven to rotate about the rotation axis O by the rotary mechanism 21 of the stage driving mechanism 13, the rotation guide portion 43A rotates the base portion 41 and the sample carrying portion 61, and the function portion 62 integrally with the stage 12. The rotation guide portion 43A includes, for example, the base coupling portion 43a and an insulation coupling portion 43d. The insulation coupling portion 43d is made of, for example, a material having high electric insulation such as a resin or ceramics. The insulation coupling portion 43d is fixed to the coupling portion 63 of the function stage 51 through, for example, fastening.

The connection end portion 64 is connected to the first support portion 44 and is fixed to the fixing guide portion 48. The connection end portion 64 is connected to the connection member 47A. The connection member 47A includes, for example, the cable 47a including a connector for an electric signal and a power supply. The first support portion 44 is configured to support the base portion 41 configured to rotate relative to the connection end portion 64 about the rotation axis O. The fixing guide portion 48 is configured to guide fixing of the connection end portion 64 and the connection member 47A, which is connected to the connection end portion 64, independently of the base portion 41.

As illustrated in FIG. 6, the coupling portion 63 and the connection end portion 64 are connected to the conduction/connection portion 65. The conduction/connection portion 65 is, for example, a connector for rotational connection. The conduction/connection portion 65 is configured to connect the sample carrying portion 61, which is configured to be driven by the stage 12, the function portion 62, and the coupling portion 63 to the connection end portion 64 and the connection member 47A, which is connected to the connection end portion 64, in such a manner that the sample carrying portion 61, the function portion 62, and the coupling portion 63 are movable relative to the connection end portion 64 and the connection member 47A in a state of conduction. The conduction/connection portion 65 includes, for example, a first connection portion 65a and a second connection portion 65b. The first connection portion 65a is fixed to the coupling portion 63. The second connection portion 65b is fixed to the connection end portion 64. The first connection portion 65a and the second connection portion 65b rotate relative to each other about the rotation axis O while maintaining a state of conduction with each other.

In the above-mentioned first modification example, in addition to the fixing guide portion 48 configured to guide the fixing of the connection member 47A independently of the base portion 41, there is provided the conduction/connection portion 65 configured to connect the sample carrying portion 61, which is configured to be driven by the stage 12, and the connection member 47A, which is regulated in position with respect to the sample chamber 11, in such a manner that the sample carrying portion 61 and the connection member 47A are movable relative to each other in the state of conduction, thereby being capable of easily changing the position and the posture of the sample S. The conduction/connection portion 65 includes the first connection portion 65a and the second connection portion 65b configured to rotate relative to each other while maintaining the state of conduction with each other, thereby being capable of suppressing occurrence of a defect such as twisting and winding of the connection member 47A. With this configuration, while the application of, for example, current and voltage to the sample S and measurement are ensured, the position and the posture of the sample S can suitably be set by the stage driving mechanism 13, thereby being capable of easily performing sample analyses of various types.

In the above-mentioned embodiment, the base coupling portion 43a of the rotation guide portion 43 is arranged apart from the rotation axis O. However, the present invention is not limited to this configuration. The center axis of the base coupling portion 43a may be the same as the rotation axis O.

FIG. 9 is a sectional view for illustrating a configuration of a sample holder 19B in a second modification example of the embodiment. FIG. 10 is a partial enlarged view for illustrating the region X illustrated in FIG. 9. In the following, parts which are the same as those of the above-mentioned embodiment are denoted by the same reference symbols, and description thereof is omitted or simplified.

As illustrated in FIG. 10, in the sample holder 19B of the second modification example, a rotation guide portion 43B includes the base coupling portion 43a, the heat-insulating portion 43b, the heat-insulation coupling portion 43c, and the insulation coupling portion 43d, which are arranged in the stated order along the rotation axis O and integrated with one another.

The base coupling portion 43a has, for example, a rod-like outer shape extending along the rotation axis O. A first end portion of both ends of the base coupling portion 43a in the Z-axis direction is fixed to the base portion 41.

The heat-insulating portion 43b is provided at a second end portion of the both ends of the base coupling portion 43a in the Z-axis direction. The heat-insulating portion 43b is made of, for example, an adiabatic material having low heat conductivity such as a resin. The heat-insulating portion 43b supports the heat-insulation coupling portion 43c.

The heat-insulation coupling portion 43c is, for example, an adiabatic member having the structure with low heat conductivity such as a thin pipe. The heat-insulation coupling portion 43c is fixed to the insulation coupling portion 43d.

The insulation coupling portion 43d is fixed to the coupling portion 42b of the sample carrying portion 42. The insulation coupling portion 43d is made of an adiabatic material having low heat conductivity such as a resin.

As illustrated in FIG. 9, the first support portion 44 of the sample holder 19B is arranged not on the cooling stage 46 but on a shaft portion 48e connected to the fixing portion 48a of the fixing guide portion 48. The first support portion 44 is configured to support the base portion 41 configured to rotate relative to the fixing guide portion 48 about the rotation axis O.

The cooling stage 46 of the sample holder 19B is arranged in such a manner as to be sandwiched between the second support portion 45 and the fixing portion 48a of the fixing guide portion 48 from both sides in the Z-axis direction at a position apart from the rotation axis O as seen from the Y-axis direction. The second end portion 46c of the cooling stage 46 is fixed to the fixing guide portion 48 without being connected to the first support portion 44.

The fixing guide portion 48 of the second modification example includes a third support portion 48d arranged on the fixing portion 48a. The third support portion 48d is, for example, a bearing. The third support portion 48d is configured to support the base coupling portion 43a configured to rotate relative to the fixing portion 48a about the rotation axis O.

In the above-mentioned second modification example, the center axis of the rotation guide portion 43B is the same as the rotation axis O. Accordingly, even when the base portion 41 and the sample carrying portion 42 rotate by 360° about the rotation axis O, the rotation guide portion 43B and the connection member 47 connected to the cooling stage 46 are prevented from interfering with each other. With this configuration, while the occurrence of a defect such as twisting or winding of the connection member 47 is suppressed, the position and the posture of the sample S can suitably be set by the stage driving mechanism 13, thereby being capable of improving the accuracy in, for example, producing and processing the sample S.

The charged particle beam device 10 according to the embodiment and modification examples includes the conveyance member 31 configured to convey the sample holder 19, 19A, 19B between the sample chamber 11 and the replacement chamber 18, thereby being capable of achieving various functions to be performed with respect to the sample S while suppressing the complexity of the device configuration. For example, without need for modification of, for example, the stage 12 provided in the sample chamber 11 and formation of ports of various types in the sample chamber 11, the various functions to be performed with respect to the sample S can easily be changed by replacement of the sample holder 19, 19A, 19B.

In the abovementioned embodiment, description is made of the case in which the charged particle beam device 10 is a complex beam device using an electron beam and a focused ion beam. However, the present invention is not limited to this configuration. For example, the charged particle beam device 10 may be a focused ion-beam device or an electron beam device.

An embodiment of the present invention described above are presented as examples, and is not intended to limit the scope of the invention. The novel embodiment may be implemented in other various modes, and various kinds of omissions, replacements, and modifications can be made thereto without departing from the gist of the invention. The embodiment and modifications thereof are included in the scope and gist of the invention, and are included in the scopes of the invention described in the appended claims and their equivalents.

What is claimed is:

1. A sample holder, comprising:
a base portion configured to be fixed to a driving stage;
a sample carrying portion configured to carry a sample;
a drive guide portion configured to guide synchronous drive of the base portion and the sample carrying portion;
a function portion configured to perform a predetermined function with respect to the sample;
a connection member configured to be connected to the function portion;
a first support portion configured to support the base portion, which is configured to be driven by the driving stage, and the connection member in such a manner that the base portion and the connection member are movable relative to each other; and
a fixing guide portion, which is connected to the base portion through intermediation of the first support portion, and is configured to guide fixing of the connection member independently of the base portion.

2. The sample holder according to claim 1, further comprising a second support portion configured to support the sample carrying portion, which is configured to be driven by the driving stage, and the function portion in such a manner that the sample carrying portion and the function portion are movable relative to each other,
wherein the function portion is connected to the sample carrying portion through intermediation of the second support portion.

3. The sample holder according to claim 1, wherein the function portion is configured to cool the sample carrying portion with use of a refrigerant which flows through a flow passage formed inside and the connection member.

4. The sample holder according to claim 2, wherein the function portion is configured to cool the sample carrying portion with use of a refrigerant which flows through a flow passage formed inside and the connection member.

5. The sample holder according to claim 3, wherein the drive guide portion has a heat-insulating structure.

6. The sample holder according to claim 4, wherein the drive guide portion has a heat-insulating structure.

7. The sample holder according to claim 1, further comprising a conduction/connection portion configured to connect the function portion, which is fixed to the sample carrying portion configured to be driven by the driving stage, and the connection member in such a manner that the function portion and the connection member are movable relative to each other in a state of conduction.

8. A charged particle beam device, comprising:
the sample holder of claim 1;
a sample chamber on which the driving stage is arranged;
a charged-particle beam lens column configured to irradiate the sample with a charged particle beam;
a replacement chamber mounted to the sample chamber;
an opening/closing portion configured to open and close a boundary between the sample chamber and the replacement chamber; and
a conveyance member configured to convey the sample holder between the sample chamber and the replacement chamber.

9. A charged particle beam device, comprising:
the sample holder of claim 2;
a sample chamber on which the driving stage is arranged;
a charged-particle beam lens column configured to irradiate the sample with a charged particle beam;
a replacement chamber mounted to the sample chamber;
an opening/closing portion configured to open and close a boundary between the sample chamber and the replacement chamber; and
a conveyance member configured to convey the sample holder between the sample chamber and the replacement chamber.

10. A charged particle beam device, comprising:
the sample holder of claim 3;
a sample chamber on which the driving stage is arranged;
a charged-particle beam lens column configured to irradiate the sample with a charged particle beam;
a replacement chamber mounted to the sample chamber;
an opening/closing portion configured to open and close a boundary between the sample chamber and the replacement chamber; and
a conveyance member configured to convey the sample holder between the sample chamber and the replacement chamber.

11. A charged particle beam device, comprising:
the sample holder of claim 4;
a sample chamber on which the driving stage is arranged;
a charged-particle beam lens column configured to irradiate the sample with a charged particle beam;
a replacement chamber mounted to the sample chamber;
an opening/closing portion configured to open and close a boundary between the sample chamber and the replacement chamber; and
a conveyance member configured to convey the sample holder between the sample chamber and the replacement chamber.

12. A charged particle beam device, comprising:
the sample holder of claim 5;
a sample chamber on which the driving stage is arranged;
a charged-particle beam lens column configured to irradiate the sample with a charged particle beam;
a replacement chamber mounted to the sample chamber;
an opening/closing portion configured to open and close a boundary between the sample chamber and the replacement chamber; and
a conveyance member configured to convey the sample holder between the sample chamber and the replacement chamber.

13. A charged particle beam device, comprising:
the sample holder of claim 6;
a sample chamber on which the driving stage is arranged;
a charged-particle beam lens column configured to irradiate the sample with a charged particle beam;

a replacement chamber mounted to the sample chamber;
an opening/closing portion configured to open and close a boundary between the sample chamber and the replacement chamber; and
a conveyance member configured to convey the sample holder between the sample chamber and the replacement chamber.

14. A charged particle beam device, comprising:
the sample holder of claim 7;
a sample chamber on which the driving stage is arranged;
a charged-particle beam lens column configured to irradiate the sample with a charged particle beam;
a replacement chamber mounted to the sample chamber;
an opening/closing portion configured to open and close a boundary between the sample chamber and the replacement chamber; and
a conveyance member configured to convey the sample holder between the sample chamber and the replacement chamber.

* * * * *